Aug. 11, 1964 O. H. SCHWARTZ 3,144,626

TUNING MECHANISM

Filed Feb. 15, 1961 2 Sheets-Sheet 1

INVENTOR
Otto H. Schwartz
BY Francis W. Crotty
ATTORNEY

Aug. 11, 1964 O. H. SCHWARTZ 3,144,626

TUNING MECHANISM

Filed Feb. 15, 1961 2 Sheets-Sheet 2

INVENTOR
Otto H. Schwartz

BY Francis W. Crotty
ATTORNEY

United States Patent Office 3,144,626
Patented Aug. 11, 1964

3,144,626
TUNING MECHANISM
Otto H. Schwartz, Elmwood Park, Ill., assignor to Zenith Radio Corporation, a corporation of Delaware
Filed Feb. 15, 1961, Ser. No. 89,570
10 Claims. (Cl. 334—51)

This invention relates in general to wave signal tuners and is particularly directed to an improvement in fine tuning for the channel selector arrangement of a television receiver.

Channel selection in television receivers usually involves a manually adjustable selector which brings into the circuitry of the receiver both a selector for the input of the receiver and a frequency-determining circuit for the heterodyne or local oscillator to yield a signal of the optimum intermediate frequency through the usual heterodyning process. It has been conventional practice in the past to provide a pair of adjustments in the channel selector, usually in the circuit of the local oscillator. One of these adjustments is set at the factory and the other, customarily referred to as a vernier or fine tuning control, may be adjusted in the viewer's location to optimize the response of the receiver. This is generally true both for the case of band switch tuning arrangements and the turret type tuner; obviously, it is very desirable to arrange for optimized adjustment of station selection with a single as distinguished from a pair of oscillator adjustments.

One approach to this desired objective is described and claimed in copending application Serial No. 28,105, now Patent 3,016,505, filed May 10, 1960, in the name of George C. Collins, and assigned to the same assignee as the present invention. The arrangement there illustrated is a turret tuner in which the oscillator coil of each individual tuning strip is slug-tuned and the tuning slug projects beyond the end of the tuning strip toward an end wall of the shield container in which the turret is housed. An access aperture is provided in that end wall in order to admit a tool which may engage the end of the tuning slug to permit its adjustment. The tool, which is secured to the tuner for manipulation by the viewer, is normally biased to a rest position in which it is free from all engagement with the turret in order that the turret may freely rotate. The mounting of the tool is such that a fine tuning knob or control may be pushed inward to advance the tool through the access aperture of the shield structure into engagement with the tuning slug. After having advanced the tool and accomplished its operative connection with the slug, rotation of the same vernier tuning knob results in fine tuning adjustments. This is an acceptable answer to the problem under consideration but the present invention is a distinct improvement thereover.

The arrangement here described affords fine tuning adjustments for the individual tuning strips of the turret through a structure in which the viewer need only rotate the vernier control knob. This avoids the necessity of manipulating the tool to achieve a mechanical connection with the tuning slug as a first step which is then followed by a second step in which the now engaged vernier control actuates the tuning slug. In other words, the manipulative steps required of the user are reduced and the operation is simplified, both of which features are highly attractive.

It is therefore a principal object of the invention to provide an improved fine tuning adjustment for the station selector of a wave signal receiver, especially for the channel selector of a television set.

It is an important object of the invention to provide a simplified fine tuning control for the channel selector for a television receiver.

A specific object of the invention is the provision of a new and improved fine tuning adjustment for the individual tuning strips of a turret type channel selector for a television receiver.

A tuner constructed in accordance with the invention and employed for controlling the tuning of a wave signal receiver comprises a frequency selector which includes a displaceable tuning element having a driven portion to be engaged by a driving member to effect displacement of the tuning element and tuning of the selector. There is a movable station selector having a plurality of operating conditions or positions in one of which the aforesaid frequency selector is operationally included in the circuitry of the receiver to control its tuning to a preselected station frequency. There is a tuning shaft having a driving member and normally retained in a rest position with said driving member out of the path of relative movement between the driving member and the driven portion of the tuning element but displaceable to an operative position in which the driving member mechanically engages the driven portion of the aforesaid tuning element during intervals in which the frequency selector is operationally included in the circuitry of the receiver. Finally, there is an actuating mechanism comprising a rotatable control shaft coupled to the tuning shaft and means responsive solely to the rotation of the control shaft for displacing the driving member to its operative position and for actuating the driving member to drive the aforesaid driven portion of the tuning element.

While the invention has application to a variety of tuning arrangements, it lends itself especially well to tuners of the turret type. When adapted to that type of tuner, the tuning slug of a coil on each tuning strip, preferably the coil comprising the frequency-determining circuit of the local oscillator, projects beyond the end of the tuning strip and its projecting end portion may be contoured or shaped to facilitate engagement with a driving member or tool. This tool may be a type of socket wrench for grasping the free end of the tuning slug or it may be a gear to be placed in meshing engagement with a gear portion formed on or affixed to the free end of the tuning slug. Therefore, and in accordance with the invention, the usual fine tuning control of the receiver, when rotated in either direction, is employed to first establish a mechanical connection of the tool and tuning slug and thereafter, upon continued rotation, to achieve fine tuning adjustments.

The features of the present invention which are believed to be novel are set forth with particularity in the appended claims. The organization and manner of operation of the invention, together with further objects and advantages thereof, may best be understood by reference to the following description taken in connection with the accompanying drawings, in the several figures of which like reference numerals identify like elements, and in which:

Figures 1, 1A:
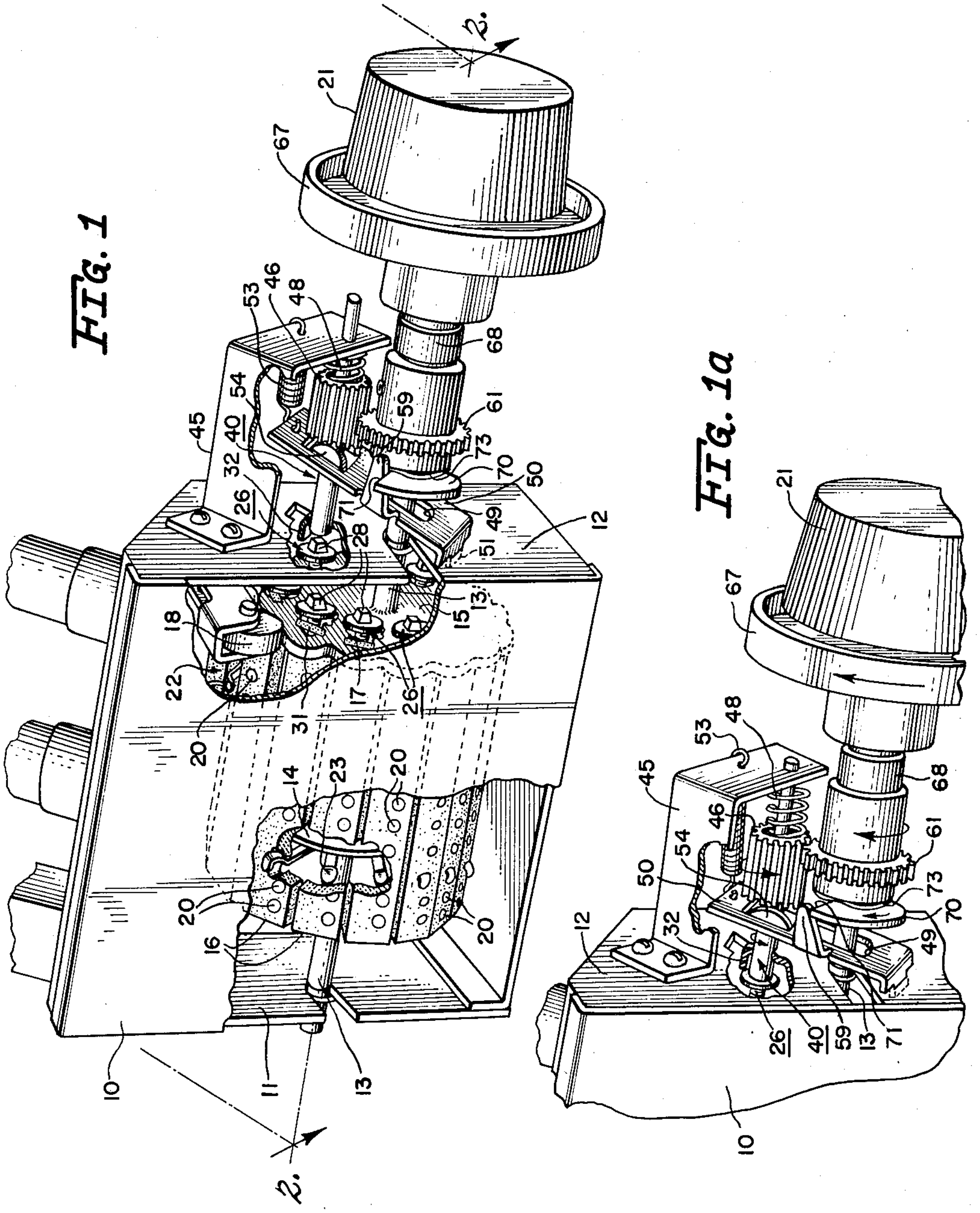
FIGURE 1 is a perspective view, partly in section, of a turret type tuner embodying the subject invention.
FIGURE 1A represents the arrangement of FIGURE 1 during fine tuning adjustment.

It is of course understood that the tuner constitutes what is normally referred to as the front end of a television receiver including the input selector to which the antenna is connected, the local oscillator and the first detector or heterodyne stage wherein a received signal is converted into a signal of appropriate intermediate frequency for translation through the remainder of the television receiver. One or more stages of radio frequency amplification may also be employed, if desired, being interposed between the antenna input and the first detector. The usual function of the channel selector, be it of the band switch or turret type, is to modify the circuitry of the front end so that it is highly selective to a desired station frequency. Considering more particularly the function of the turret tuner illustrated in the drawing, the turret in any of its many operating conditions introduces an RF selector at the antenna input, an RF impedance in the output of the RF amplifier, an appropriate reactance or tuning circuit for the local oscillator and an appropriate input reactance for the first detector so related to one another in respect of their individual frequency response or tuning as to achieve optimum conditions for the selection of a desired television channel. Both the circuitry of such a turret tuner and its principles of operation are well known in the art; for example, they are set forth in Patent 2,596,117, issued on May 13, 1952, to John F. Bell et al., and assigned to the same assignee as the present invention. Accordingly, this circuitry has not been shown in the annexed drawings nor will it be discussed in detail further.

Referring now more particularly to FIGURE 1, the arrangement there represented is a turret type tuner for controlling the tuning of a television receiver with which the turret is operationally connected but, as indicated above, the associated circuitry of the receiver has been omitted for the purpose of simplicity. The turret has an enclosing shield container having end walls 11 and 12 and a side panel 10. Vacuum tubes, indicated by the usual symbols, are mounted on another panel which does not show in the view of FIGURE 1. The end plates 11 and 12 are slotted to receive and rotatably support a shaft 13 of a turret having a pair of end members 14 and 15. A plurality of tuning strips 16 are supported by these end members to define in conjunction therewith the well-known form of turret tuning device.

End member 14 may conveniently take the form of a spider constructed of a number of resilient, radially extending arms 23. There is one such arm for each tuning strip and each strip has an aperture through which the arm projects as the strip is positioned in place and supported by end members 14 and 15. Generally, each section of the spider has a seat upon which the tuning strip rests, see FIGURE 2, and a clamping portion for overlapping the strip to hold it in place on the seat.

Figure 3:
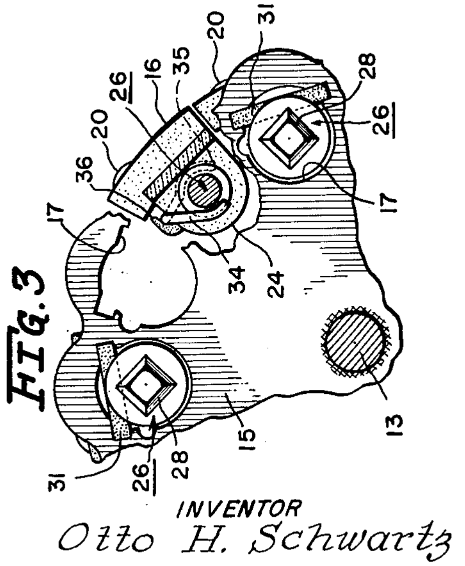
FIGURE 3 is a detail taken along section lines 3—3 of FIGURE 2.

The end member 15 of the turret has a series of essentially T-shaped apertures 17, see FIGURE 3, corresponding in number to the maximum number of tuning strips to be accommodated by the turret. Each of strips 16 has a configuration at one end including a shoulder 31 which is complementary to that of aperture 17 for insertion therein in order to support the strip upon end member 15. The peripheral edge of member 15 is scalloped to provide a series of indentations which cooperate with a detent roller 18 journalled upon a spring biased detent lever. The engagement of the detent roller with the periphery of member 15 affords positive indexing of the turret assembly.

The turret has a plurality of operating conditions or positions to which it may be adjusted by manipulation of a channel selector knob 21 affixed to one end of shaft 13. Each such condition is established by the seating of detent 18 within an indentation of member 15 and in each such position, the index position, one of the family of tuning strips is presented to the stationary contact bank 22 indicated in FIGURE 2. This bank of contacts represents the circuit connections of the receiver front end to which a tuning strip is to be connected in order to associate that strip functionally or operatively with the receiver circuits. Each strip carries the necessary circuit components, indicated as coils 19, 19' in FIGURE 2, for tuning the receiver to a single selected station or channel. Each of the circuit components on the strip is conductively connected with contacts 20 carried on the face of the strip and presented to stationary contact bank 22 when that particular strip is to be operative. The engagement of these contacts completes the circuit connections necessary to place the strip in functional or operative relation with the receiver front end.

It is the adjustment of one or more of these components of the individual tuning strip that is involved in vernier or fine tuning of the receiver and experience has shown that it is sufficient to operate upon a single frequency selector of the strip, where the expression "frequency selector" is used to mean an impedance which may be adjusted to determine the dominant frequency response or characteristic of the strip. With the strip as represented in FIGURE 2, fine tuning is accomplishd by adjusting the apparent inductance of coil 19' comprising the the principal tuning inductance of the local oscillator.

Inductor 19' has a displaceable tuning element in the form of a tuning slug which is effective to modify the inductance of the coil depending upon the extent to which the slug extends within the coil turns. The slug is designated 26 and is displaceable in the axial direction of coil 19'. Its displacement is accomplished by rotating the slug which has a threaded shank and a driven portion 28 to be engaged by a rotatable tuning control driver. The driven portion or head 28 of the slug projects beyond panel 15 of the turret and the head has a terminating flange which may engage stop abutments 31, 32 to limit the displacement of the slug to a desired range. Stop abutment 31 conveniently comprises a projection of strip 16 which extends beyond panel 15 a desired amount. Another abutment 32, struck out of panel 12 of the shield enclosure, is located in axial alignment with the slug to limit its outward displacement. Obviously, the apertures 17 of end plate 15 are dimensioned to permit the flanged head of the tuning slug to pass therethrough.

Figure 2:
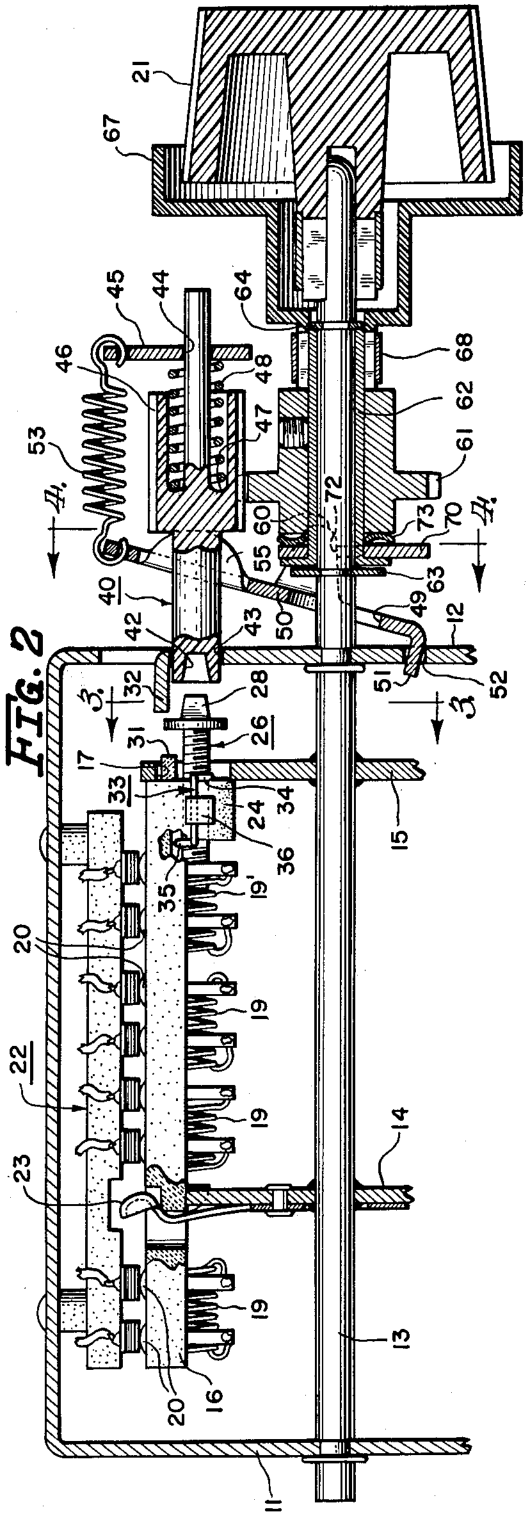
FIGURE 2 is a sectional view taken generally along section lines 2—2 of FIGURE 1.

The mounting of the tuning slug on the strip and the arrangement for permitting it to advance or retract from coil 19' with rotation of the slug is shown more particularly in FIGURES 2 and 3 and is the subject of a concurrently filed application Serial No. 89,422, now Patent 3,058,075, filed in the name of Eugene J. Polley. The end of the strip adjacent panel 15 supports a housing 24 which is apertured or provided with a channelway for guiding the tuning slug into operative relation with coil 19'. Projecting from one side of housing 24 is a portion 36 which defines with member 24 a slot to receive and support a generally U-shaped and flexible member 33 having end portions 34 and 35 disposed transversely and in engagement with opposed ends of housing 24 and yieldably engaging the threaded portion of tuning element 26. End portion 35 rests on the top of the slug between convolutions of its thread while end portion 34 engages the undersurface of the slug and rests between convolutions of its thread. Since member 33 is held stationary by housing 24 and engages the threads of the slug, rotation of the slug causes it to be displaced axially of coil 19' in a direction determined by its direction of rotation. Moreover, since clamp 33 is flexible, continued rotation of the slug after it has been displaced to abut either of stops 31 and 32 merely causes end portions 34, 35 to raise up and reseat themselves in their respective threads. Consequently, the continued rotation of the slug does not damage the thread nor does it cause binding of the slug itself.

The tool or driving member through which the tuning slug may be adjusted is designated 40. It is normally retained in a rest position but is displaceable to an operative position in which it mechanically engages the head 28 of the tuning element on the turret strip which happens, at that time, to be instantaneously effective in controlling the tuning of the receiver. More specifically, the tool 40 is an elongated device disposed approximately parallel to the axis of coil 19′ adjacent panel member 15 and adjacent the head 28 of the tuning slug. It has provisions at the end 42 to engage the head 28 of the tuning slug to establish a mechanical connection therebetween through which fine tuning adjustments may be made. Where the head 28 is pyramidal in form as indicated, terminal portion 42 of the tool may be a socket or recess for application over the head 28 of the tuning slug. Of course, other complementary configurations may be employed for these elements to achieve a suitable mechanical interconnection particularly since the load represented by the tuning slug is indeed very small.

Toward its other end, tool 40 carries a gear 46 through which it may conveniently be rotated. The tool is slidably supported in an aperture 43 of shield panel 12 and also in an aperture 44 formed in an L-shaped bracket 45 affixed to the same panel of the shield container. Being slidably supported, it may be advanced toward the tuning slug and retracted therefrom with ease.

A lever 50 serves normally to retain tool 40 in its rest position out of engagement with the tuning slug. This lever has a transversely disposed tab 51 at one end which is received in an aperture 52 of shield panel 12 to support the lever for pivotal movement. Of course, the lever is slotted as shown at 49 so that turret shaft 13 may pass freely therethrough. Toward its opposite end, lever 50 is provided with a pair of abutment surfaces 54, 55 which bear against the gear portion 46 of tool 40, it being understood that the gear portion of the tool is of larger diameter than the portion which carries the socket 42 so that a shoulder surface is provided against which abutments 54, 55 may rest. A spring 53 anchored between the free end of lever 50 and bracket 45 constitutes means for biasing tool 40 to its aforedescribed rest position. Spring 53 works against a spring 48 which spans between bracket 45 and a recess 47 formed in gear section 46 of the tool and tending to urge the tool toward its operative position in which it is coupled to tuning slug 26. Spring 53 is the stronger so that the tool is normally kept in its rest position as stated.

An actuating mechanism is employed to facilitate advancing tool 40 to its operative position. It comprises a rotatable actuator which may be the usual fine tuning knob 67 and means responsive to rotation of the fine tuning knob for displacing tool 40 to its operative position and for concurrently rotating the tool in order to accomplish fine tuning. More particularly, the actuating mechanism under consideration includes a driving gear 61 in continuous driving engagement with gear 46 of tool 40. Gear 61 is secured through a set screw to a bushing 62 journalled upon turret shaft 13 for rotation with respect thereto and is maintained in position along the shaft by washers 63 and 64.

Figure 4:
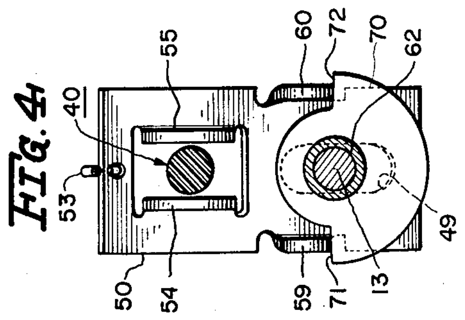
FIGURE 4 is a view taken along section lines 4—4 of FIGURE 2.

There is also included in the actuating mechanism a cam 70 for displacing lever 50 to overcome biasing spring 53 and displace tool 40 to its operative position. Cam 70 is mounted on bushing 62 and captivated thereon by a slip-friction clutch comprising the flanged end of bushing 62 and a spring washer 73. The cam has a pair of lobes 71, 72 which are normally disposed horizontally as indicated in FIGURE 4. They are located immediately beneath a pair of cam follower portions 59, 60 which project from pivoted lever 50. The cam followers are triangular in shape and occasion displacement of lever 50 toward shield panel 12 whenever cam 70 is rotated in either direction from the rest position of FIGURE 4. Concurrent actuation of drive gear 61 and cam 70 is accomplished by fine tuning knob 67 which is supported in nested concentric relation to station selector knob 21. The inner portion of knob 67 overlaps bushing 62 and is mechanically coupled thereto by means of a tension strap 68.

In considering the operation of the described arrangement it will be understood that fine tuning is not resorted to unless it is necessary and the arrangement under consideration permits the adjustment to be made with minimum of manipulative steps. In order to tune the receiver, station selector knob 21 is rotated and the turret is moved in step-by-step fashion in clockwise or counter-clockwise direction at the election of the user. Such rotation of the turret presents the individual tuning strips sequentially to their operative position to the end that each strip is individually and sequentially brought into functional relation with the front end of the receiver. This selection process continues until the strip corresponding to the station that is desired has been brought to the operative position indicated in FIGURE 2. During this channel selection process lever 50 is in its rest position, bias spring 53 overcomes spring 48 and retains tool 40 in its rest position all as illustrated in FIGURE 2. As a consequence, the socket termination of the tool is adjacent but free of head 28 of the tuning slug. If the instantly operative tuning strip 16 is sharply tuned there is no occasion to adjust the fine tuning control but, should less than optimum image reproduction be attained, vernier tuning may be resorted to in an effort to improve reception.

To accomplish fine tuning, the fine tuning knob 67 is rotated and it will be assumed initially that it is rotated in a clockwise direction as indicated in the operational view of FIGURE 1A. In response to continued rotation of the fine tuning knob, cam 70 is displaced in the clockwise direction by virtue of the clutch action of spring washer 73. Cam lobe 71 engages cam follower 59 to deflect lever 50 in the direction of shield panel 12. This permits spring 48 to advance tool 40 toward tuning slug 26 so that its socket termination 42 accepts head 28 of the slug to establish a mechanical connection therebetween. Concurrently with the displacement of lever 50, driving gear 61 rotates the tool in a counter-clockwise direction to move the slug relative to the field of coil 19′ and adjust the operating frequency of the local oscillator in one sense. Adjustment of the oscillator frequency in the opposite sense is occasioned by rotating vernier control knob 67 in a counter-clockwise direction. In response to that motion of the fine tuning control, cam lobe 72 operating upon cam follower 60 displaces lever 50 and tool 40 to engage slug 26 and rotate it in a clockwise direction. The adjustment of the slug in the appropriate direction proceeds until optimum tuning is achieved.

Figure 5:
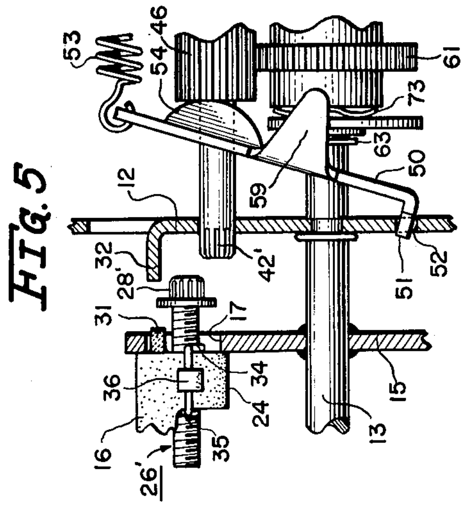
FIGURE 5 represents a modified form of the structure of FIGURE 1.

In the modification of FIGURE 5, the terminal portion 42′ of tool 40 which is to engage the tuning slug has a gear formed therein and the head 28′ of the tuning slug 26′ is likewise shown as having a gear configuration. Mechanical engagement is now brought about by advancing tool 40 in the direction of turret panel 15 in order that the gear sections may mesh. Aside from this different form of tool and slug termination, the arrangement is the same as that shown and described in connection with FIGURES 1 and 2.

The described fine tuning arrangement is exceedingly simple to operate and yet exhibits the positive driving action required to accomplish the tuning function. It is particularly attractive in that simple rotary motion of the fine tuning knob establishes a mechanical connection of the adjusting tool while continued rotation achieves a fine tuning adjustment.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A tuner for controlling the tuning of a wave signal receiver, comprising: a frequency selector including a displaceable tuning element having a driven portion to be engaged by a driving member to effect displacement of said tuning element and tuning of said selector; a movable station selector having a plurality of operating positions in one of which said frequency selector is operationally included in the circuitry of said receiver to control the tuning thereof to a preselected station frequency; a tuning shaft having a driving member and normally retained in a rest position with said driving member out of the path of relative movement between said driving member and said driven portion but displaceable to an operative position in which said driving member mechanically engages said driven portion of sad tuning element during intervals in which said frequency selector is operationally included in the circuitry of said receiver; and an actuating mechanism comprising a rotatable control shaft coupled to said tuning shaft and means responsive solely to rotation of said control shaft for displacing said driving member to its operative position and actuating said driving member to drive said driven portion of said tuning element.

2. A tuner for controlling the tuning of a wave signal receiver, comprising: a frequency selector including a rotatable tuning element having a driven portion to be engaged by a driving member to effect displacement of said tuning element and tuning of said selector; a movable station selector having a plurality of operating positions in one of which said frequency selector is operationally included in the circuitry of said receiver to control the tuning thereof to a preselected station frequency; an axially displaceable tuning shaft having a rotatable driving member and normally retained in a rest position with said driving member out of the path of relative movement between said driving member and said driven portion but displaceable to an operative position in which said driving member mechanically engages said driven portion of said tuning element during intervals in which said frequency selector is operationally included in the circuitry of said receiver; and an actuating mechanism comprising a rotatable control shaft coupled to said tuning shaft and means responsive solely to rotation of said control shaft for axially displacing said driving member to its operative position and rotating said driving member to rotate said tuning element.

3. A tuner for controlling the tuning of a wave signal receiver, comprising: a frequency selector including a rotatable tuning element having a driven portion to be engaged by a driving member to effect displacement of said tuning element and tuning of said selector; an adjustable station selector having a plurality of operating positions in one of which said frequency selector is operationally included in the circuitry of said receiver to control the tuning thereof to a preselected station frequency; a tuning shaft having a driving member; a lever normally retaining said tuning shaft in a rest position with said driving member out of engagement with said tuning element but displaceable to an operative position in which it mechanically engages said driving member with said driven portion of said tuning element during intervals in which said frequency selector is operationally included in the circuitry of said receiver; and an actuating mechanism comprising a rotatable control shaft coupled to said tuning shaft and means responsive solely to rotation of said control shaft for displacing said lever to its operative position and concurrently rotating said driving member to rotate said tuning element.

4. A tuner for controlling the tuning of a wave signal receiver, comprising: a frequency selector including a rotatable tuning element having a driven portion to be engaged by a driving member to effect displacement of said tuning element and tuning of said selector; an adjustable station selector having a plurality of operating positions in one of which said frequency selector is operationally included in the circuitry of said receiver to control the tuning thereof to a preselected station frequency; a tuning shaft having a driving member; a lever normally retaining said tuning shaft in a rest position with said driving member out of engagement with said tuning element but displaceable to an operative position in which it mechanically engages said driving member with said driven portion of said tuning element during intervals in which said frequency selector is operationally included in the circuitry of said receiver; and an actuating mechanism comprising a control shaft having a driving gear in continuous driving engagement with said tuning shaft, an actuator for displacing said lever to its aforeseaid operative position, and a fine tuning knob rotatable in either direction, coupled to said control shaft to effect rotation of said driving gear and also coupled to said actuator to effect concurrent displacement of said lever in response to such rotation of said knob.

5. A tuner for controlling the tuning of a wave signal receiver, comprising: a frequency selector including a rotatable tuning element having a driven portion to be engaged by a driving member to effect displacement of said tuning element and tuning of said selector; an adjustable station selector having a plurality of operating positions in one of which said frequency selector is operationally included in the circuitry of said receiver to control the tuning thereof to a preselected station frequency; an axially displaceable elongated driving member disposed approximately parallel to said tuning element, having provisions at one end for engaging said driven portion of said tuning element and having a gear portion; means for supporting said driving member for axial movement between a rest position out of engagement with said tuning element and an operative position in which it engages said driven portion of said tuning element if said station selector is in its aforesaid one operating position; and an actuating mechanism comprising a driving gear in continuous driving engagement with said gear portion of said driving member and means for rotating said driving gear in a selected direction and concurrently axially displacing said driving member to its aforesaid operative position in response to such rotation.

6. A tuner for controlling the tuning of a wave signal receiver, comprising: a frequency selector including a rotatable tuning element having a driven portion to be engaged by a driving member to effect displacement of said tuning element and tuning of said selector; an adjustable station selector having a plurality of operating positions in one of which said frequency selector is operationally included in the circuitry of said receiver to control the tuning thereof to a preselected station frequency; an elongated driving member disposed approximately parallel to said tuning element, having provisions at one end for engaging said driven portion of said tuning element and having a gear portion; means for supporting said driving member for movement between a rest position out of engagement with said tuning element and an operative position in which it engages said driven portion of said tuning element if said station selector is in its aforesaid one operating position; means for biasing said driving member to its aforesaid rest position; and an actuating mechanism including a driving gear in continuous driving engagement with said gear portion of said driving member, a cam for overcoming said biasing means, spring means for displacing said driving member to said operative position, and means for concurrently rotating said driving gear and operating said cam to effect displacement of said driving member in response to such rotation.

7. A tuner for controlling the tuning of a wave signal receiver, comprising: a frequency selector including a rotatable tuning element having a driven portion to be engaged by a driving member to effect displacement of said tuning element and tuning of said selector; an adjustable station selector having a plurality of operating positions in one of which said frequency selector is operationally included in the circuitry of said receiver to control the tuning thereof to a preselected station frequency; an elongated driving member disposed approximately parallel to said tuning element, having provisions at one end for engaging said driven portion of said tuning element and having a gear portion; means for supporting said driving member for movement between a rest position out of engagement with said tuning element and an operative position in which it engages said driven portion of said tuning element if said station selector is in its aforesaid one operating position; means for biasing said driving member to its aforesaid rest position; an actuating mechanism including a driving gear in continuous driving engagement with said gear portion of said driving member, a cam for overcoming said biasing means, spring means for displacing said driving member to said operative position, means for concurrently rotating said driving gear and operating said cam to effect displacement of said driving member in response to such rotation, and stop means for limiting the displacement of said tuning element to a predetermined range of travel.

8. A turret tuner for controlling the tuning of a wave signal receiver, comprising: a plurality of tuning strips for individually tuning said receiver to a single selected station and individually having a frequency selector including a displaceable tuning element having a driven portion to be engaged by a driving member to effect displacement of said tuning element and tuning of said selector; an adjustable station selector having a plurality of operating positions in each of which one of said selector tuning strips is moved into an operative position in which said strip is operationally included in the circuitry of said receiver to control the tuning thereof to a preselected station frequency; a tuning shaft having a driving member normally retained in a rest position but displaceable to an operative position in which it mechanically engages the driven portion of the tuning element of the one of said strips instantaneously effective in controlling the tuning of said receiver; and an actuating mechanism comprising a rotatable control shaft coupled to said tuning shaft and means responsive solely to rotation of said control shaft for displacing said driving member to its operative position and actuating said driving member to drive said driven portion of said tuning element of said one strip.

9. A turret tuner for controlling the tuning of a wave signal receiver, comprising: a plurality of tuning strips for individually tuning said receiver to a single selected station and individually having a frequency selector including a displaceable tuning element having a driven portion to be engaged by a driving member to effect displacement of said tuning element and tuning of said selector; an adjustable station selector comprising a pair of end members supporting said tuning strips to define a turret having a plurality of operating positions in one of which the frequency selector of one of said tuning strips is operationally included in the circuitry of said receiver to control the tuning thereof to a preselected station frequency, the driven portion of the tuning element of each of said strips projecting beyond one of said end members; a tuning shaft having a driving member and normally retained in a rest position with said driving member adjacent said one end member of said turret but displaceable to an operative position in which said driving member mechanically engages the driven portion of the tuning element of said one strip during intervals in which said one strip is operationally included in the circuitry of said receiver; and an actuating mechanism comprising a rotatable control shaft coupled to said tuning shaft and means coupled to said tuning shaft and responsive solely to rotation of said control shaft for displacing said driving member to its operative position and actuating said driving member to drive said driven portion of the tuning element of said one strip.

10. A turret tuner for controlling the tuning of a wave signal receiver, comprising: a plurality of tuning strips for individually tuning said receiver to a single selected station and individually having a frequency selector including a rotatable, threaded tuning element having a driven portion to be engaged by a driving member to effect displacement of said tuning element and tuning of said selector; an adjustable station selector comprising a pair of end members supporting said tuning strips to define a turret having a plurality of operating positions in one of which the frequency selector of one of said strips is operationally included in the circuitry of said receiver to control the tuning thereof to a preselected station frequency, the driven portion of the tuning element of each of said strips projecting beyond one of said end members; an axially displaceable tuning shaft having a rotatable driving member and normally retained in a rest position with said driving member adjacent said one end member of said turret but displaceable to an operative position in which said driving member mechanically engages the driven portion of the tuning element of said one strip during intervals in which said one strip is operationally included in the circuitry of said receiver; and an actuating mechanism comprising a rotatable control shaft coupled to said tuning shaft and means responsive solely to rotation of said control shaft for displacing said driving member to its operative position and rotating said driving member to drive said driven portion of the tuning element of said one strip.

References Cited in the file of this patent

UNITED STATES PATENTS

| | | |
|---|---|---|
| 2,580,895 | Detar | Jan. 1, 1952 |
| 2,839,936 | Dawson | June 24, 1958 |
| 2,942,108 | Goldstein et al. | June 21, 1960 |
| 2,975,276 | Thias | Mar. 14, 1961 |
| 2,981,838 | Poskozim | Apr. 25, 1961 |
| 3,022,674 | Cross et al. | Feb. 27, 1962 |
| 3,058,075 | Polley | Oct. 9, 1962 |
| 3,069,639 | Cappelle et al. | Dec. 18, 1962 |